United States Patent [19]

Collier

[11] Patent Number: 5,040,991

[45] Date of Patent: Aug. 20, 1991

[54] ELECTRICAL CONNECTORS

[75] Inventor: John C. Collier, Southport, United Kingdom

[73] Assignee: ITT Industries Limited, New York, N.Y.

[21] Appl. No.: 600,057

[22] Filed: Oct. 18, 1990

[30] Foreign Application Priority Data

Oct. 19, 1989 [GB] United Kingdom ............... 8923547

[51] Int. Cl.⁵ .............................................. H01R 9/09
[52] U.S. Cl. .................................... 439/60; 439/630; 439/637
[58] Field of Search ............... 439/59, 60, 62, 260, 439/630, 636, 637

[56] References Cited

U.S. PATENT DOCUMENTS

| | | | |
|---|---|---|---|
| 4,705,338 | 11/1987 | Sitzler | 439/630 |
| 4,780,095 | 10/1988 | Classon et al. | 439/637 |
| 4,806,103 | 2/1989 | Kniese et al. | 439/60 |
| 4,869,672 | 9/1989 | Andrews, Jr. | 439/60 |

FOREIGN PATENT DOCUMENTS 900332 7/1962 United Kingdom .
1183561 3/1970 United Kingdom .

Primary Examiner—Paula A. Bradley
Attorney, Agent, or Firm—Thomas L. Peterson

[57] ABSTRACT

An electrical connector comprises a body accommodating one group of staggered rows of spring contacts for engagement with cone-shaped contacts arranged in correspondingly staggered rows on a printed circuit board. The spring contacts of one row have intermediate flattened parts which slidingly engage with peaks of the corresponding dome-shaped contacts thereby requiring low insertion force while curved parts of spring contacts of the other row are riding up the convex profile of the corresponding dome-shaped contacts requiring high insertion force. Two similar groups of staggered rows of spring contacts may be provided for accommodating boards having staggered rows of raised contacts on both sides of the board.

14 Claims, 1 Drawing Sheet

ELECTRICAL CONNECTORS

BACKGROUND OF THE INVENTION

1. Field of the Invention

This invention relates to electrical connectors and relates more specifically to electrical edge connectors comprising a connector body which accommodates spring contacts for making electrical engagement with raised (e.g., dome-shaped) printed circuit or wiring board contacts near an edge of the board when the edge of the board is inserted into the usual board-receiving opening of the connector body.

2. Description of the Prior Art

Such edge connectors may include two rows of spring contacts which are staggered relatively to one another in the direction of insertion of a printed circuit board into the connector so that they make electrical engagement with correspondingly staggered rows of raised (e.g., dome-shaped) contacts on the board when the latter is fully inserted into the connector. Two such rows of staggered spring contacts may be provided for engaging correspondingly staggered rows of raised printed circuit board contacts on one or each side of the inserted printed circuit board.

As will be appreciated, the maximum insertion force required to insert the board having staggered contacts into a connector having correspondingly staggered spring contacts can be very considerable in cases where very large numbers of contact engagements need to be made as the board is inserted.

BRIEF SUMMARY OF THE INVENTION

The present invention reduces the total force required for inserting a printed circuit board having staggered of offset contacts into an electrical connector having correspondingly staggered spring contacts. The reduction in total force is accomplished by providing an edge connector having a connector body which accommodates at least one group of staggered rows of spring contact for electrical engagement with corresponding rows of correspondingly staggered raised contacts (e.g., dome-shaped) provided on one side of a printed circuit board. The direction of offset or staggering is in the direction of insertion of the board into the connectors. The spring contacts of one row of spring contacts are provided with relatively short intermediate flattened parts which slidingly engage with corresponding raised contacts of the printed circuit board as the board is being inserted into the connector, when parts of the spring contacts of the other row of spring contacts are riding up the profiles of corresponding raised board contacts. The edge of the printed circuit board comes to rest inside the electrical connector body with curved or rounded parts of the spring contacts of the rows of spring contacts preferably just passing beyond the center lines of convex profiles or sections of the raised board contacts in order to provide snap engagement between the board and the connector.

By means of this invention, the maximum insertion force required to insert the board into the connector is not as great as it would otherwise be if the contacts of both rows of staggered spring contacts were of the same configuration over the sections where they make contact with the raised board contacts during insertion of a board. The reason for this is that as the spring contacts of one row are being lifted by the profiles of their corresponding raised board contacts the flattened parts of the spring contacts of the other or another row of spring contacts are simply slidingly engaging with the rounded peaks of their corresponding raised board contacts. It is envisaged, for example, that the maximum insertion force may be reduced by about 35% which will be particularly advantageous in the case of those connectors having very large numbers of spring contacts.

As will readily be appreciated, the present invention is equally applicable to edge connectors having two groups of staggered rows of spring contacts which are respectively arranged on opposite sides of the connector body cavity for receiving a printed circuit or wiring board and which engage with staggered rows of raised contacts on the respective sides of the inserted board. In this case, one row of spring contacts from each group may be provided with flattened parts in order to reduce the maximum insertion force as described above.

The invention can thus be characterized as an electrical edge connector for connection to a printed circuit board having a plurality of board contacts disposed on one side thereof in two rows staggered or offset in a predetermined direction. The invention comprises a first plurality of conductive spring contacts, each having a curved portion for contacting one of the two staggered rows of board contacts. A second plurality of conductive spring contacts is provided and each has two curved portions and a flattened portion lying between the two curved portions for contacting the other one of the two staggered rows of board contacts. An insulating connector body has a body cavity. The first and second plurality of spring contacts are disposed in the body cavity. Insertion of the board into the edge connector is in the predetermined direction. The flattened portions of the second plurality of spring contacts slidingly engage the board contacts of the printed circuit board thereby requiring relatively low insertion force when the curved portion of the first plurality of spring contacts are lifted and ride up on the board contacts, thereby requiring relatively high insertion force as the board is inserted into the connector.

Each spring contact of the first plurality of spring contacts is paired with one spring contact of the second plurality of spring contacts.

The board has two sides with each provided with the board contacts. The first and second plurality of spring contacts are each arranged in two groups. One group is disposed in the body cavity on one side of the board and the other group is disposed in the cavity on the other side of the board.

The body cavity has a depth chosen relative to a predetermined location of the board contacts on the printed circuit board. The predetermined location of the board contact is characterized by a centerline of the board contact, so that when the board is fully inserted into the body cavity, the curved part of each the spring contact of the first and second plurality of spring contacts lies just beyond the center line of convex profiles of the corresponding board contacts so that snap-action engagement is provided between the connector and printed circuit board.

The invention is also a method for coupling a printed circuit board to an edge connector comprising the steps of inserting the board into a body cavity of the connector until a first row of board contacts disposed on the printed circuit board contact a first curved portion of a first plurality of spring contacts. A first degree of increased force is applied to continue inserting the board into the body cavity and to lift the first plurality of spring contacts over the board contacts until the board contacts are in sliding engagement with a flattened portion of the first plurality of contacts. A substantially reduced degree of force is applied to continue inserting the board into the body cavity to slide the board contacts against the flattened portion of the first plurality of contacts until a second row of board contacts disposed on the printed circuit board contact a curved portion of a second plurality of spring contacts. An increased degree of force is applied to continue inserting the board into the body cavity to lift the second plurality of spring contacts over the second row of board contacts. The total force to insert the board into the connector is substantially reduced even though both the first and second rows of board contacts are engaged by the first and second plurality of spring contacts respectively.

The method further comprising the step of continuing to apply force to the board to insert the board into the connector until a second curved portion of the first plurality of spring contacts and the curved portion of the second plurality of spring contacts slide off the corresponding first and second rows of board contacts to allow the board to be retained within the body cavity of the connector.

In the step of applying a substantially reduced force to continue inserting the board into the connector, the total of the force required to insert the board in the connector is reduced by approximately 35%.

By way of example the present invention will now be described with reference to the accompanying drawings.

DETAILED DESCRIPTION OF THE PREFERRED EMBODIMENTS

Figure 1:
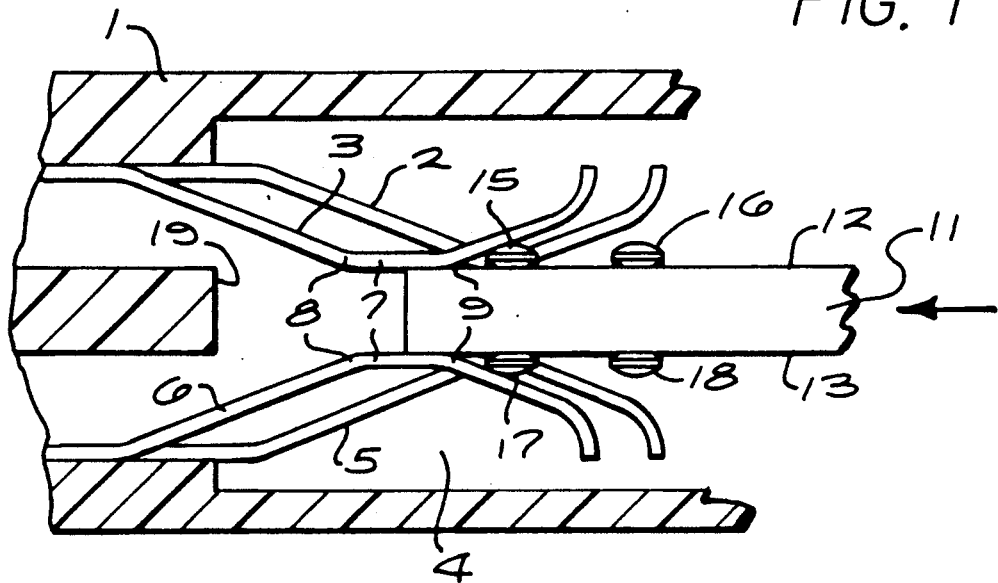
FIGS. 1-3 illustrate diagrammatically the progressive stages of insertion of a printed circuit or wiring board into an electrical edge connector constructed in accordance with the present invention.

An electrical connector comprises a body accommodating one group of staggered rows of spring contacts for engagement with cone-shaped contacts arranged in correspondingly staggered rows on a printed circuit board. The spring contacts of one row have intermediate flattened parts which slidingly engage with peaks of the corresponding dome-shaped contacts thereby requiring low insertion force whilst curved parts of spring contacts of the other row are riding up the convex profile of the corresponding dome-shaped contacts requiring high insertion force. Two similar groups of staggered rows of spring contacts may be provided for accommodating boards having staggered rows of raised contacts on both sides of the board.

Referring to the drawings the electrical edge connector illustrated comprises an electrically insulating connector body 1 which accommodates a multiplicity of spring contacts on opposite interior positions within body 1, which contacts are grouped to provide two pairs of staggered rows of spring contacts for contact with opposite sides of the printed circuit board 11. The staggered rows of spring contacts of one pair may comprise a multiplicity of contacts including the respective contacts 2 and 3 shown in the drawings. The other pair of staggered rows of spring contacts is arranged opposite the first pair within the body cavity 4 for receiving a printed circuit or wiring board 11. The staggered rows of spring contacts of this other pair may also comprise a multiplicity of contacts including the respective spring contacts 5 and 6.

The rows of spring contacts including the contacts 3 and contact 6 respectively, are provided in accordance with the invention with relatively short intermediate flattened parts 7 which are located between curved or rounded parts 8 and 9 of the spring contacts. The rows of spring contacts including the respective contacts 2 and 5, however, simply have curved or rounded contact making parts 10 best seen in FIGS. 2 and 3.

Considering now the insertion into the edge connector of printed circuit board 11 having on each of the respective major surfaces 12, 13 thereof, near an edge 14, two rows of staggered dome-shaped contacts, the contacts of one row on surface 12 of the board including contact 15 and the contacts of the other row on the surface 12 including contact 16. The rows of contacts on the other board surface 13 include respective contacts 17 and 18.

Figure 2:
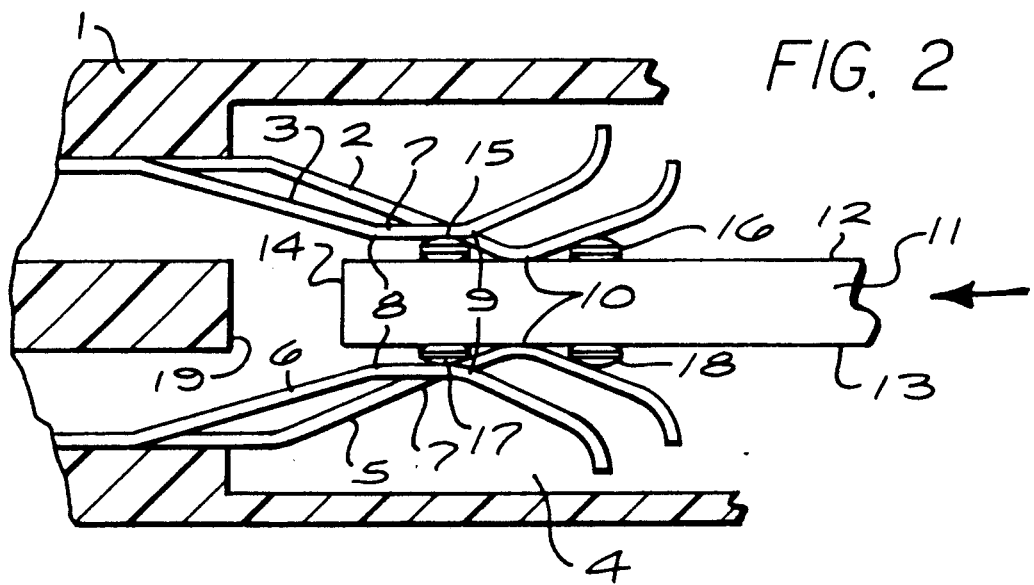

As will be apparent from FIG. 1, when the board 11 being inserted into the edge connector in the direction of the arrow reaches the position illustrated, the curved parts 10 of the spring contact 2 and 5 are just clear of the board surfaces 12 and 13, respectively, so that no insertion force is required by these spring contacts. However, spring contacts 3 and 6 are about to be lifted by the dome-shaped contacts 15 and 17, respectively, requiring a relatively high insertion force to be applied to the printed circuit board 11. Once the spring contacts 3 and 6 have been lifted and the curved or rounded parts 9 of the spring contact ride up the convex profile of the board contacts 15 and 17, the flattened parts 7 of the spring contacts 3 and 6 then slidingly engage with the convex peaks of the board contacts as shown in FIG. 2. At this stage of insertion of the board, however, the other spring contacts 2 and 5 are about to be lifted by the dome-shaped contacts 16 and 18, respectively requiring a relatively high insertion force to be exerted on the board 11, but the simultaneous sliding engagement of the flattened parts 7 of the spring contacts 3 and 6 with the corresponding board contacts reduces the overall insertion force required, since the sliding friction only requires 30% of the maximum insertion force (i.e., when spring contacts are to be lifted by engagement with the board contacts). The total insertion force required to lift contacts 2 and 5 will therefore be reduced by 35% ([100−30]/2=35).

Figure 3:
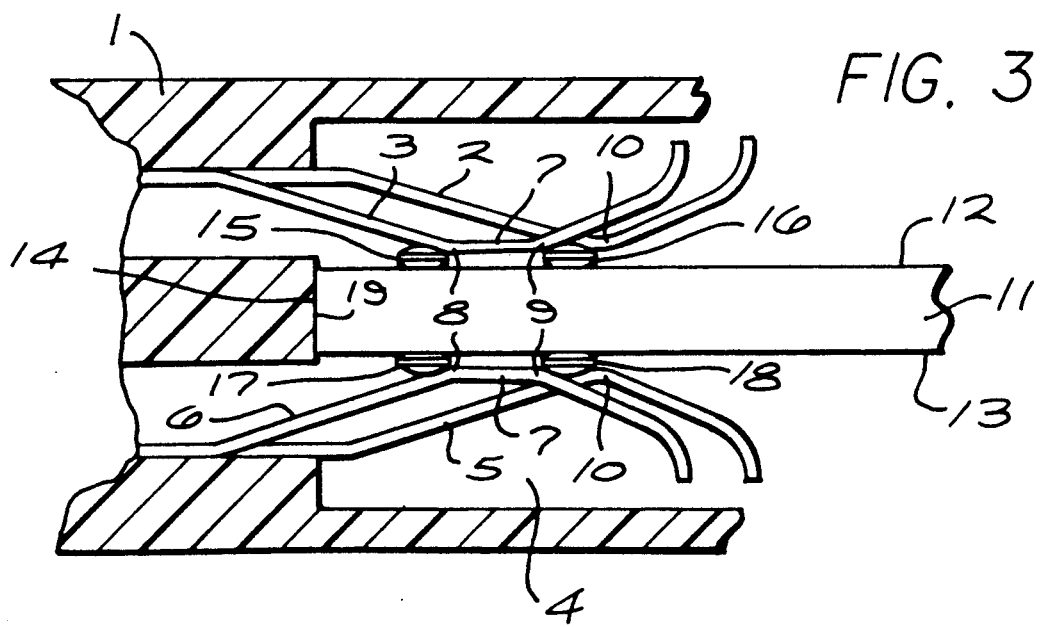

When the printed circuit board 11 is fully inserted, as shown in FIG. 3, the foremost edge 14 of the printed circuit board 11 will bear against an abutment surface 19 of the connector body. Just prior to this, the curved or rounded parts 10 of the spring contacts 2 and 5 and the curved or rounded parts 8 of the spring contacts 3 and 6 will move over the board contacts to points beyond the center lines of the dome-shaped contacts with which they are engaging. As they do so, the stored spring pressure in the spring contacts exert forces on the printed circuit board which produce a momentary acceleration of the board in the direction of insertion thereof into the connector thereby providing a snap-type engagement between the board and connector. This force will also serve to resist withdrawal and improve retention of the board within the connector.

This feature of providing an electrical connecting arrangement between an edge connector and printed circuit or wiring board which is positive and promotes retention of the board within the connector is fully described in our co-pending patent application Ser. No. 07/566,632 filed Aug. 18, 1990.

The edge connector of this invention could also be electrically shielded by the arrangement forming the subject of our co-pending patent application Ser. No. 574,321 filed Aug. 29, 1990 and/or adapted selectively to accept printed circuit boards having particular contact arrangements in accordance with our co-pending patent application Ser. No. 596,647 filed Oct. 10, 1990.

We claim:

1. An electrical edge connector for connection to a printed circuit board having a plurality of board contacts disposed on one side thereof in staggered rows comprising:
    a plurality of spring contacts;
    an insulating connector body having a body cavity which accommodates at least two staggered rows of said spring contacts for electrical engagement with rows of said correspondingly staggered board contacts having a raised profile provided on one side of a printed circuit, said staggering of said board contacts being in a direction of insertion of said board into said edge connector;
    wherein said spring contacts of one row of spring contacts are provided with relatively short intermediate flattened parts which slidingly engage with said corresponding raised board contacts of said printed circuit board thereby requiring relatively low insertion force as said board is being inserted into said connector and when parts of said spring contacts of said other row of said two rows of spring contacts are being lifted and riding up said raised profile of said corresponding board contacts thereby requiring relatively high insertion force.

2. The electrical edge connector of claim 1 wherein said spring contacts have a curved part and wherein said body cavity has a depth chosen relative to a predetermined location of said raised board contacts on said printed circuit board, said predetermined location of said board contact being characterized by a centerline of said board contact, so that when said board is fully inserted into said body cavity, said curved part of said spring contact lie just beyond said center line of convex profiles of said board contacts in order to provide snap-action engagement between said connector and printed circuit board.

3. The electrical edge connector of claim 1 wherein said plurality of spring contacts are arranged into two opposed groups of staggered rows and wherein said connector body accommodates said two opposed groups of staggered rows of spring contacts within said body cavity for receiving said printed circuit board so that said groups of spring contacts engage with staggered rows of raised board contacts provided on respective sides of a printed circuit wiring board.

4. The electrical edge connector of claim 3 wherein said spring contacts have a curved part and wherein said body cavity has a depth chosen relative to a predetermined location of said raised board contacts on said printed circuit board, said predetermined location of said board contact being characterized by a centerline of said board contact, so that when said board is fully inserted into said body cavity, said curved part of said spring contact lie just beyond said center line of convex profiles of said board contacts in order to provide snap-action engagement between said connector and printed circuit board.

5. An electrical edge connector for connection to a printed circuit board having a plurality of board contacts disposed on one side thereof in two rows staggered in a predetermined direction comprising:
    a first plurality of conductive spring contacts each having a curved portion for contacting one of said two staggered rows of board contacts;
    a second plurality of conductive spring contacts each having two curved portions and a flattened portion lying between said two curved portions for contacting the other one of said two staggered rows of board contacts; and
    an insulating connector body having a body cavity, said first and second plurality of spring contacts disposed in said body cavity, insertion of said board into said edge connector being in said predetermined direction;
    wherein said flattened portions of said second plurality of spring contacts slidingly engage said board contacts of said printed circuit board thereby requiring relatively low insertion force when said curved portion of said first plurality of spring contacts are being lifted and riding up on said board contacts thereby requiring relatively high insertion force as said board is being inserted into said connector.

6. The connector of claim 5 wherein said body cavity has a depth chosen relative to a predetermined location of said board contacts on said printed circuit board, said predetermined location of said board contact being characterized by a centerline of said board contact, so that when said board is fully inserted into said body cavity, said curved part of each said spring contact of said first and second plurality of spring contacts lies just beyond said center line of convex profiles of said corresponding board contacts so that snap-action engagement is provided between said connector and printed circuit board.

7. The connector of claim 5 wherein each spring contact of said first plurality of spring contacts is paired with one spring contact of said second plurality of spring contacts.

8. The connector of claim 7 wherein said board has two sides each provided with said board contacts, and wherein said first and second plurality of spring contacts are each arranged in two groups, one group being disposed in said body cavity on one side of said board and the other group being disposed in said cavity on the other side of said board.

9. The connector of claim 7 wherein said body cavity has a depth chosen relative to a predetermined location of said board contacts on said printed circuit board, said predetermined location of said board contact being characterized by a centerline of said board contact, so that when said board is fully inserted into said body cavity, said curved part of each said spring contact of said first and second plurality of spring contacts lies just beyond said center line of convex profiles of said corresponding board contacts so that snap-action engagement is provided between said connector and printed circuit board.

10. The connector of claim 5 wherein said board has two sides each provided with said board contacts, and wherein said first and second plurality of spring contacts are each arranged in two groups, one group being disposed in said body cavity on one side of said board and the other group being disposed in said cavity on the other side of said board.

11. The connector of claim 10 wherein said body cavity has a depth chosen relative to a predetermined location of said board contacts on said printed circuit board, said predetermined location of said board contact being characterized by a centerline of said board contact, so that when said board is fully inserted into said body cavity, said curved part of each said spring contact of said first and second plurality of spring contacts lies just beyond said center line of convex profiles of said corresponding board contacts so that snap-action engagement is provided between said connector and printed circuit board.

12. A method for coupling a printed circuit board to an edge connector comprising the steps of:
inserting said board into a body cavity of said connector until a first row of board contacts disposed on said printed circuit board contact a first curved portion of a first plurality of spring contacts;
applying a first degree of increased force to continue inserting said board into said body cavity and to lift said first plurality of spring contacts over said board contacts until said board contacts are in sliding engagement with a flattened portion of said first plurality of contacts;
applying a substantially reduced degree of force to continue inserting said board into said body cavity to slide said board contacts against said flattened portion of said first plurality of contacts until a second row of board contacts disposed on said printed circuit board contact a curved portion of a second plurality of spring contacts; and
applying an increased degree of force to continue inserting said board into said body cavity to lift said second plurality of spring contacts over said second row of board contacts, so that the total force to insert said board into said connector is substantially reduced even though both said first and second rows of board contacts are engaged by said first and second plurality of spring contacts respectively.

13. The method of claim 12 further comprising the step of continuing to apply force to said board to insert said board into said connector until a second curved portion of said first plurality of spring contacts and said curved portion of said second plurality of spring contacts slide off said corresponding first and second rows of board contacts to allow said board to be retained within said body cavity of said connector.

14. The method of claim 12 where in said step of applying a substantially reduced force to continue inserting said board into said connector, the total of said force required to insert said board in said connector is reduced by approximately 35%.

* * * * *